US012808354B2

(12) United States Patent
Madsen et al.

(10) Patent No.: US 12,808,354 B2
(45) Date of Patent: Nov. 24, 2026

(54) CONDITION MONITORING DEVICE FOR A LIGHTNING PROTECTION SYSTEM OF A WIND TURBINE BLADE

(71) Applicant: VC VIII POLYTECH HOLDING APS, Bramming (DK)

(72) Inventors: Søren Find Madsen, Hvalsø (DK); Richard Baker, Lichfield (GB); Stephan Vogel, Copenhagen (DK)

(73) Assignee: VC VIII POLYTECH HOLDING APS, Bramming (DK)

( * ) Notice: Subject to any disclaimer, the term of this patent is extended or adjusted under 35 U.S.C. 154(b) by 131 days.

(21) Appl. No.: 18/721,330

(22) PCT Filed: Dec. 19, 2022

(86) PCT No.: PCT/EP2022/086778
§ 371 (c)(1),
(2) Date: Jun. 18, 2024

(87) PCT Pub. No.: WO2023/117993
PCT Pub. Date: Jun. 29, 2023

(65) Prior Publication Data

US 2025/0059956 A1 Feb. 20, 2025

(30) Foreign Application Priority Data

Dec. 22, 2021 (EP) .................................... 21216911

(51) Int. Cl.
*G01R 31/54* (2020.01)
*F03D 17/00* (2016.01)
*F03D 80/30* (2016.01)

(52) U.S. Cl.
CPC .......... *F03D 17/028* (2023.08); *F03D 80/30* (2016.05); *G01R 31/54* (2020.01)

(58) Field of Classification Search
CPC ........ G01R 31/54; G01R 31/08; G01R 31/12; G01R 31/02; G01R 31/58; G01R 19/165
(Continued)

(56) References Cited

U.S. PATENT DOCUMENTS 6,741,069 B1 * 5/2004 Klemar .................. F03D 80/30 324/72
2010/0119370 A1 * 5/2010 Myhr ..................... F03D 80/30 416/169 R
(Continued)

FOREIGN PATENT DOCUMENTS

DE 10 2017 120407 A1 10/2018
DE 10 2020 102152 A1 7/2021
(Continued)

OTHER PUBLICATIONS

International Search Report and Written Opinion of the International Searching Authority dated Apr. 18, 2023 (13 pages) out of PCT Priority Application PCT/EP2022/086778.
(Continued)

*Primary Examiner* — Lee E Rodak
*Assistant Examiner* — Taqi R Nasir
(74) *Attorney, Agent, or Firm* — Crowell & Moring LLP

(57) ABSTRACT

A condition monitoring device for a lightning protection system (LPS) of a wind turbine blade, wherein the condition monitoring device is mountable to a wind turbine. The device includes a signal generation unit configured to generate and input probe signals into a protection unit of the LPS and/or to at least one tower conducting unit. The device includes a measurement unit configured to detect response signals, which are a system response of the probe signals via a wireless coupling between the LPS and the tower con-
(Continued)

ducting unit. A control unit is configured to control the signal unit and the measurement unit and to process the response signals.

19 Claims, 4 Drawing Sheets

(58) Field of Classification Search
USPC ................................ 324/500, 537, 535, 606
See application file for complete search history.

(56) References Cited

U.S. PATENT DOCUMENTS

| | | | | |
|---|---|---|---|---|
| 2018/0010583 | A1* | 1/2018 | Andersen | H01R 4/66 |
| 2021/0140409 | A1* | 5/2021 | Schlüter | F03D 17/00 |
| 2021/0324834 | A1* | 10/2021 | Guzzo | F03D 80/30 |

FOREIGN PATENT DOCUMENTS

| | | | |
|---|---|---|---|
| EP | 3916412 | A1 | 12/2021 |
| KR | 10-2014-0078147 | A | 6/2014 |

OTHER PUBLICATIONS

International Preliminary Report on Patentability dated Jun. 20, 2024 (6 pages) out of PCT Priority Application PCT/EP2022/086778.

Extended European Search Report dated Jun. 15, 2022 (7 pages) out of European Priority Application 21216911.4.

* cited by examiner

CONDITION MONITORING DEVICE FOR A LIGHTNING PROTECTION SYSTEM OF A WIND TURBINE BLADE

This application is a National Stage application of International Application No. PCT/EP2022/086778, filed Dec. 19, 2022, the entire contents of which are incorporated herein by reference.

This application claims priority under 35 U.S.C. § 119 (a) to European Patent Application No. 21216911.4, filed on Dec. 22, 2021, the entire contents of each of which are incorporated herein by reference.

DESCRIPTION BACKGROUND OF THE INVENTION

Technical Field

The present invention relates to a condition monitoring device for a lightning protection system, a condition monitoring system, and a method for an operation monitoring of a wind turbine.

Description of the Related Art

Lightning protection systems of wind turbine blades are usually physical electrical conductors embedded in the structure of the blade. These conductors are typically routed inside the blade and/or are integrated in the shell of the blade.

The integrity of a lightning protection system of a wind turbine is typically validated with a DC continuity measurement between the external receptors of the blade and the blade root. These measurements are typically done after manufacturing, after installation and typically repetitive every one to two years during operation of the turbine.

However, a DC continuity measurement detects only the presence of a path with resistance below a certain threshold. In case the lightning protection system is characterized by several parallel conductive elements (typically the case, e.g., in carbon fiber reinforced polymer blades, or for blades with additional conductive components equipotentialised to the down conductor), a fault is likely not detected and the blade is in the risk of being severely damaged by the next lightning attachment.

Moreover, a DC continuity measurement is labor extensive, governed by HSE (health, safety and/or environment) issues and comparatively slow, as it requires a rope-access from outside of a wind turbine blade. A person needs to rappel down a blade and connect the DC measurement equipment to the outside of the receptors at the tip of the blade to validate whether there is an electrical continuity to the root end of the LPS or not.

These measurements are therefore considered to be rather time-consuming and complex, inflexible and expensive. In addition, they may only take place at discrete single intervals, so that damage that occurs a short time after the last measurement potentially remains unnoticed for a longer period of time.

In view of the foregoing, an objective of the present invention is to provide a condition monitoring device that overcomes the aforementioned disadvantages, and allows a straightforward, reliable and operator-friendly status monitoring of a wind turbine blade LPS and interfaces to other conductive components.

An objective of the invention is solved by a condition monitoring device, a condition monitoring system, and a method for an operation monitoring of a wind turbine in accordance with the invention.

In particular, an objective of the invention is solved by a condition monitoring device for a lightning protection system of a wind turbine blade, wherein the condition monitoring device is mountable to a wind turbine, including:

- a signal generation unit configured to generate and input probe signals into a protection unit of the lightning protection system of the wind turbine blade and/or to at least one tower conducting unit; and
- a measurement unit configured to detect response signals, which are a system response of the probe signals via a wireless coupling between the lightning protection system of the wind turbine blade and the tower conducting unit;
- a control unit configured to control the signal unit and the measurement unit and to process the response signals.

An idea of the present invention is to monitor the condition of a lightning protection system of a wind turbine blade by injecting pulses and/or repetitive signals with specific rise-times and in specific frequency ranges into a protection unit of the lightning protection system of the blade. Subsequently a signal processing of the response signals is performed (either in the device and/or in a remote computing system). Thereby the condition of the lightning protection system is determined. In feasibility studies it turned out, that a return path for the response signal is important to ensure consistent results. Therefore, the measurements are performed preferably when the blade is aligned with the tower, providing a wireless coupling (preferably a capacitive coupling) between lightning protection system of the blade and tower and thereby enabling the return-path for the response signal. With this concept, the condition of the lightning protection system can be validated continuously during the operation of the turbine. Thus the condition of the wind turbine can also be validated without the need of physical presence of technicians, to avoid the potentially dangerous rope-access operations.

In addition, damages that are triggered and progressively develop over time, may be identified early by the present invention such that repairs can be initiated in due time. Repairing (blades or lightning protection systems of) a wind turbine before damage worsen will save both, repair costs as well a down time of the wind turbine.

A system response is in particular considered to be an impedance or a reflection (signal) in the path or system including the blade and/or the lightning protections system of the blade, the tower conducting unit, and the wireless (in particular capacitive) coupling between these components. It is preferable, that the tower conducting unit is connected galvanically to the wind turbine, in particular to act as the conductor for returning the signal to the condition monitoring device.

In a preferred embodiment, the wireless coupling includes comprises a capacitive coupling between the lightning protection system of the blade and the tower conducting unit.

A return path for the signals is a way important to ensure consistent results of the measurement. Therefore, the measurements are performed via a capacitive coupling between the lightning protection system of the blade and the tower conducting unit. Thereby a (reproducible) return path for the signals is enabled. Moreover, with the used coupled electrodes consisting of the tower conducting unit and the lightning protection system of the blade, the measurement does not depend on measurements from the ground.

In alternative embodiments, the wireless coupling between the lightning protection system and the tower conduction unit may also be realized or supported by the use of sending and receiving means, e.g., including an antenna connected to the lightning protection system and a corresponding receiver connected to the tower conducting unit.

According to an embodiment, the protection unit of the lightning protection system includes a down conductor (or is a down conductor). Whereby an injection (input) of the probe signal directly into the (metallic) down conductor enables a reliable analysis of the whole lightning protection system, as the down conductor electrically connects other protection units of the light protection system of the blade, e.g., a tip and/or a side receptor and/or one or more CFRP structural elements.

In one embodiment, the tower conducting unit is formed at least sectionally by the exterior of the tower of the wind turbine.

Thus, a reproducible (return) path for the signals is enabled directly by use of the tower of the wind turbine. The use of the exterior of the tower is cost-effective, since it is usually made of metal (preferably steel), and/or reinforced concrete and thus a needed conductor is provided inherently, so that separate or additional conductors need not to be installed. Moreover, with the used coupled electrodes being the tower conducting unit and the lightning protection system of the blade, the measurement does not depend on measurements from the ground. Alternatively or additionally, the tower conducting unit includes comprises a conductor such as a straight conductive element, or a coaxial cable which is arranged at the exterior or inside the tower.

According to another embodiment, the signal generation unit includes a signal induction device configured to inductively input the probe signal into the protection unit and/or into the at least one tower conducting unit.

With an inductive input of the probe signal into the protection unit and/or the tower conducting unit, a hard-wired connection between the signal generation unit and the protection unit is avoided. In the event of an overvoltage or a lightning impulse current (due to a lightning strike) on the protection unit, the signal generation unit is protected.

According to another embodiment, the signal generation unit includes a waveguide coupler configured to input the probe signal into the protection unit and/or into the at least one tower conducting unit, and the waveguide coupler is preferably configured to limit overvoltage across the condition monitoring device, in particular by discharging lightning current impulses, away from the condition monitoring device to the ground.

This enables an injection of the probe signal to the protection unit and/or the tower conducting unit with high signal transmission quality in one way, whilst also providing protection from a destructive lighting impulse current in the opposite way. With this technique, a long term stable, safe and reliable measurement is enabled.

According to another embodiment, the signal generation unit is configured to be galvanically connected to the protection unit and/or the at least one tower conducting unit, preferably by a hard-wired connection comprising at least one protection device, in particular at least one surge protection device.

With this a relatively inexpensive and straightforward signal injection is realizable. In addition, less energy is needed compared to an inductive injection of the signal. The use of a protection device like a surge protection device provides protection against destructive lightning currents to the signal generation unit and/or to the condition monitoring device.

According to another embodiment, the measurement unit includes an inductive measurement device configured to inductively detect the response signals at the protection unit and/or at the at least one tower conducting unit.

With an inductive measurement device, a hard wired connection between the measurement unit and the protection unit (e.g., the down conductor of the LPS of the blade) is avoided. Alternatively or additionally, a hard wired connection between the measurement unit and the tower conducting unit is avoided. Thus, the measurement unit could be protected against destructive lightning currents.

According to another embodiment, the measurement unit is configured to be galvanically connected to the protection unit and/or to the at least one tower conducting unit, preferably by a hard-wired connection comprising at least one protection device, in particular at least one surge protection device.

With this a relatively inexpensive and straightforward measurement is realizable. With a physical (hard wired galvanic connection), a measurement quality may be enhanced, while less energy is needed (compared to an inductive measurement). The use of a protection device like a surge protection device provides protection against destructive lightning currents to the measurement unit and/or to the condition monitoring device.

According to another embodiment, the probe signals which can be generated by the signal generation unit are AC signals, in particular between 0 A and 5 A and/or 0 V and 50 V.

The use of AC signals enables to detect a status or changes of the status of the lightning protection system of the blade via impedance characteristics of the lightning protection system. A corresponding signal processing can therefore rely on travelling wave and reflection theory, as well as an analysis of resonance points. Hence, measurement quality and information that is obtainable with this technique is drastically enhanced compared to common DC measurement techniques.

With this technique, injecting probe signals as pulses and/or repetitive signals with specific rise-times and in specific frequency ranges are feasible. It is also possible to inject single steep gradient pulses of either current or voltage. Thus, potential faults can be detected in the lightning protection system. In particular, a location of the fault can be estimated. A time of the fault can be determined. A type of fault that is apparent can be determined.

According to another embodiment, the probe signals which can be generated by the signal generation unit are high frequency signals, in particular in a frequency range between 100 kHz to 10 GHz, preferably between 500 kHz to 5 GHz.

The used frequency range may depend on the used lightning protection system. In an embodiment, the condition monitoring device is configured to set a frequency, in particular with respect to the used lightning protection system. Therefore, resonance points or optimal signal conditions can be met. Thus, a measurement performance is enhanced and more information can be won.

According to another embodiment, the condition monitoring device is configured to measure the system response every time the respective wind turbine blade, including the lightning protection system, is aligned with the tower.

As stated above, the measurements are performed preferably when the blade is aligned with the tower, providing a wireless (capacitive) coupling between blade and tower and thereby enabling a return-path for the signal. Thus, generating and outputting the probe signal "only" every time the respective blade is aligned with the tower is more energy efficient compared to generating and outputting the probe signals continuously. Moreover, data generation will be reduced and signal processing can thus be fastened.

In an alternative embodiment, it is possible that the probe signals are injected continuously and a respective measurement of the response signal is (only) triggered when the respective blade is aligned with the tower.

The alignment of the tower and the blade may be determined by the response signals itself or by at least one accelerometer.

According to another embodiment, the control unit is configured to communicate with at least one, in particular remote, data storage and analyzing device. In a possible embodiment the processing of response signals performed by the control unit includes submitting the response signals to the data storage and analyzing device.

With the data storage and analyzing device, a long term monitoring of the lightning protection system is feasible by storing a large number of response signals, e.g., over days, months or years. In particular, the response signals are stored to the data storage and analyzing device in order to enable a data evaluation and comparison of different signals, e.g., for different days or under particular weather conditions. A quantitative assessment of the status of the lightning protection system can be compared across a fleet of similar blades, to provide OEMs a better understanding of the failure mechanism.

Various algorithms may be used to detect faults in the lightning protection system by analysis of the stored probe signals and response signals. Preferably the processing is performed by the control unit and/or by the data storage and analyzing device. Thereby locating a potential fault or a slowly degrading connection is enabled. Moreover, a fingerprint signal (e.g., from the day of installation) for a specific blade may be stored and compared with further response signals over a long term. Machine learning & artificial intelligence analysis methods may be implemented to track significant changes in the response signals and thereby mapping the changes in the conductive system of the blade. Significant changes from the original signature of the signals (during a short time instance or during a long time change) can indicate different failure modes in the blade.

Moreover, an objective of the invention is also particularly solved by a condition monitoring system for operation monitoring of a wind turbine comprising at least one condition monitoring device, wherein the at least one condition monitoring device includes:

- a signal generation unit configured to generate and input probe signals into a system comprising a protection unit of a lightning protection system of the wind turbine blade and/or at least one tower conducting unit; and
- a measurement unit configured to detect response signals, which are a system response of the probe signals via a capacitive coupling between the lightning protection system of the wind turbine blade and the tower conducting unit;
- a control unit configured to control the signal unit and the measurement unit and to process the response signals, and wherein the condition monitoring system further includes comprises at least one, in particular remote, data storage device that is configured to communicate with the control unit(s) of the at least one condition monitoring device in order to receive and store the probe signals and the response signals.

The advantages as described in connection with the condition monitoring device can also be achieved by the condition monitoring system. It should also be noted that the features described in the context of the condition monitoring device also apply to the condition monitoring system.

A quantitative assessment of the status of the lightning protection system can be compared across a fleet of similar blades of different wind turbines using the condition monitoring system, to provide OEMs and operators a better understanding of the failure mechanism.

Moreover, the objective of the invention is also particularly solved by a wind turbine comprising at least one condition monitoring device as described above or a condition monitoring system as described above.

The advantages as described in connection with the condition monitoring device can be also achieved by the described wind turbine. It should also be noted that the features described in the context of the condition monitoring device also apply to the described wind turbine.

According to one embodiment of the wind turbine the at least one condition monitoring device is arranged in one or in more or in all blades of the wind turbine.

With this arrangement respective blades and their lightning protection system of a wind turbine can be monitored.

In addition, the objective of the invention is also particularly solved by a method for an operation monitoring of a wind turbine, preferably by a condition monitoring device as described above, wherein the method includes the following steps:

a) Generate a probe signal;
b) Input the probe signal into at least one protection unit of a lightning protection system of the wind turbine blade, in particular a down conductor, and/or into at least one tower conducting unit;
c) Measure a response signal which is a signal response of the probe signal via a wireless, in particular capacitive, coupling between the lightning protection system of the blade and the tower.

With the method for an operation monitoring of a wind turbine according to the invention, the same advantages can be achieved as have already been described in connection with the condition monitoring device according to the invention. It should also be noted that the features described in the context of the device also apply to the system. Features of the method according to the invention can be transferred to the device by designing the device according to the method features.

According to an embodiment, the probe signals are AC signals, in particular between 0 A and 5 A and/or 0 V and 50 V, and/or in a frequency range between 100 kHz to 10 GHZ, preferably between 500 kHz to 5 GHz.

According to another embodiment, the method further comprises a step of storing and analyzing the probe signals and the response signals, wherein the analysis is preferably based on a change of impedance of the lightning protection system of the blade and/or the at least one tower conducting unit.

With this technique, of potential fault can be detected in the lightning protection system. In particular, a location of the fault can be estimated. A time of the fault can be determined. A type of fault that is apparent can be determined. A quantitative assessment of the status of the lightning protection system can be compared across a fleet of similar blades, to provide OEMs a better understanding of the failure mechanism.

According to another embodiment of the method, steps a) to c) are performed during operation of the wind turbine, in particular continuously, and/or wherein step b) is performed every time a respective wind turbine blade is aligned with the tower.

Therefore, a status (condition) of the lightning protection system can be validated without the need of physical presence of technicians, to avoid the potentially dangerous rope-access operations.

In the following, the invention is also described with respect to further details, features and advantages, which are explained in more detail with reference to the figures. The described features and combinations of features, as shown below in the figures and described with reference to the figures, are applicable not only in the respective combination indicated, but also in other combinations or in stand-alone manner, without thereby leaving the scope of the invention.

DETAILED DESCRIPTION

Figure 1A:
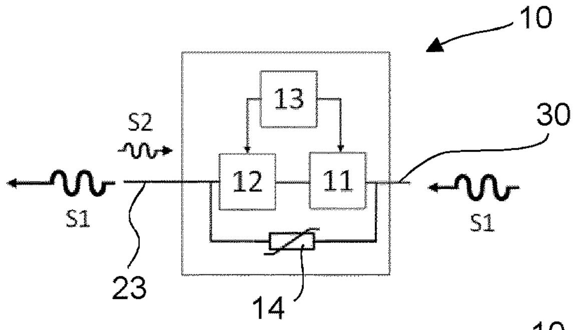
FIG. 1*a* shows a first example of an embodiment of a condition monitoring device according to the invention with hard-wired connections and a respective protection device.

In FIG. 1*a* to FIG. 1*e* examples of embodiments of a condition monitoring device 10 are shown. The condition monitoring device 10 according to FIG. 1*a* to FIG. 1*e* includes a signal generation unit 11, a measurement unit 12 and a control unit 13.

In FIG. 1*a* to FIG. 1*e* examples of embodiments of a condition monitoring device 10 are shown. The condition monitoring device 10 according to FIG. 1*a* to FIG. 1*e* comprises a signal generation unit 11, a measurement unit 12 and a control unit 13.

The condition monitoring device 10 according to FIG. 1*a* to FIG. 1*e* includes a housing, wherein the signal generation unit 11, the measurement unit 12 and the control unit 13 are arranged. Preferably, the housing (or the condition monitoring device per se) is roughly not larger than 20 cm×20 cm×20 cm, more preferably not larger than 10 cm×10 cm×10 cm.

The signal generation unit 11 is configured to generate and input (inject) probe signals $S_1$ into a protection unit 23 of the lightning protection system LPS of the wind turbine blade 20 and/or into at least one tower conducting unit 30.

The measurement unit 12 is configured to detect response signals $S_2$, which is the system response (impedance or reflection) by introducing the probe signals $S_1$ in the path consisting of the lightning protection system LPS (or parts thereof) and/or the blade 20, the tower conducting unit 30 and the capacitive coupling between these components. Alternatively, the coupling could be realized by means of one or more antennas (e.g. in the blade) and one or more corresponding receivers (e.g. in the tower).

The control unit 13 is configured to control the signal generation unit 11 and the measurement unit 12. For example, the control unit 13 is configured to trigger the signal generation unit 11 in order to generate and output a probe signal $S_1$ and/or to feed signal characteristics for the definition of a probe signal $S_1$ to the signal generation unit 11.

Moreover, the control unit 13 is configured to process the response signals $S_2$. In a possible embodiment, the response signals $S_2$ may be processed (analyzed) directly in the control unit 13. Preferably, the control unit 13 is configured to communicate with a data storage device in order to submit the received response signals $S_2$ to the data storage and analyzing device, where the response signals are stored and analyzed. Alternatively or additionally, the control unit 13 is configured to perform a pre-processing, in particular to filter out, e.g., erroneous response signals according to certain criteria (like amplitude, noise, etc.), in order to suppress processing of these signals.

For details of a corresponding lightning protection system LPS reference is made to FIG. 4 and for details on the coupling between the lightning protection system LPS and the tower conducting unit 30 reference is made to FIGS. 5*a* and 5*b* which are described later.

In FIG. 1*a* a first example of an embodiment of a condition monitoring device 10 is shown. According to FIG. 1*a*, the signal generation unit 11 and the measurement unit 12 are connected (or connectable) to a protection unit 23 of the lightning protection system LPS and/or to at least one tower conducting unit 30 by a hard wired connection.

The condition monitoring device 10 includes a protection unit 14 to protect the condition monitoring device 10 from a destructive current impulse generated, for example, during a lightning strike. In a possible embodiment, the protection unit 14 comprises at least one surge protection device.

Figure 1B:
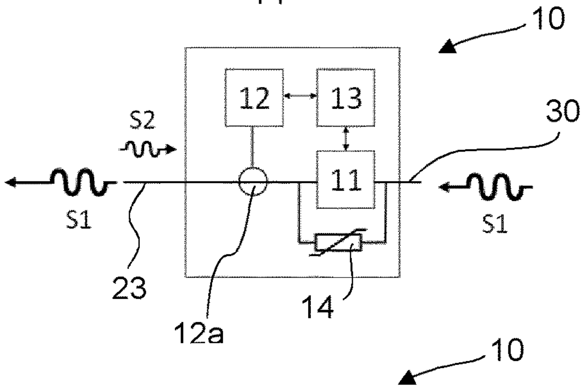
FIG. 1*b* shows a second example of an embodiment of a condition monitoring device according to the invention comprising an inductive measurement device.

FIG. 1*b* shows a second example of an embodiment of a condition monitoring device 10. In this embodiment, the measurement unit 12 comprises an inductive measurement device 12*a* configured to inductively detect the response signals $S_2$ at the protection unit 23 and/or at least one tower conducting unit 30. With the inductive measurement device 12*a* a physical (hard wired) connection between the measurement unit 12 and the protection unit 23 of the lightning protection system LPS and/or the at least one tower conducting unit 30 is avoided, in order to protect the measurement unit 12 from a destructive current pulse generated, for example, during a lightning strike.

The signal generation unit 11 is connected or connectable to the protection unit 23 of the lightning protection system LPS and/or to at least one tower conducting unit 30 by a hard wired connection. For the connection of the signal generation unit 11 the condition monitoring device 10 comprises a protection unit 14, in particular at least one surge protection device (as in example of FIG. 1*a*).

Figure 1C:
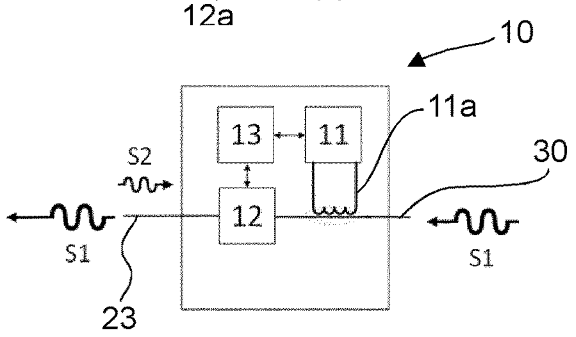
FIG. 1*c* shows a third example of an embodiment of a condition monitoring device according to the invention comprising a signal induction device.

In an alternative approach as shown in FIG. 1*c*, the condition monitoring device 10 includes a signal induction device 11*a*.

With the signal induction device 11*a*, a physical (hard wired) connection between the signal generation unit 11 and the protection unit 23 of the lightning protection system LPS and/or the at least one tower conducting unit 30 is avoided, in order to protect the signal generation unit 11 from a destructive current pulse generated, for example, during a lightning strike.

Figure 1D:
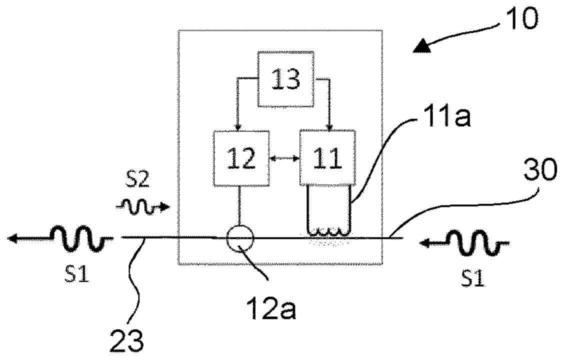
FIG. 1*d* shows a fourth example of an embodiment of a condition monitoring device according to the invention comprising a signal induction device and an inductive measurement device.

According to the example shown in FIG. 1*d*, the condition monitoring device 10 includes both, a signal induction device 11*a* and an inductive measurement device 12*b*. In this embodiment, the entire circuitry of the condition monitoring device 10 is not directly connected hard wired to the protection unit 23 of the lightning protection system LPS and/or to at least one tower conducting unit 30, so that a particularly high level of protection against destructive current pulses is provided.

Figure 1E:
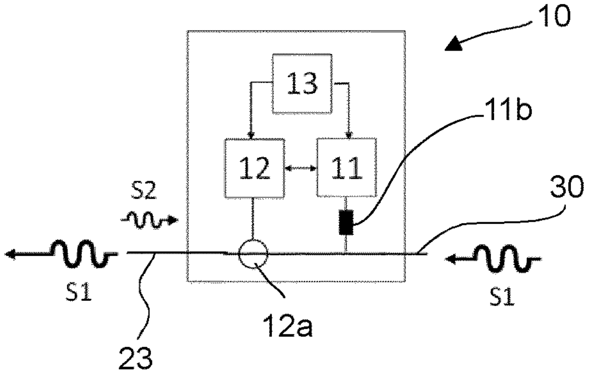
FIG. 1*e* shows a fifth example of an embodiment of a condition monitoring device according to the invention comprising a waveguide coupler.

A further embodiment of a condition monitoring device 10 is shown in FIG. 1*e*. The condition monitoring device 10 according to FIG. 1*e* comprises an inductive measurement device 12*a* as described above. However, in this embodiment, the condition monitoring device 10 includes a waveguide coupler 11*b*. The signal generation unit 11 is configured to inject the probe pulses $S_1$ to the protection unit 23 of the lightning protection system LPS and/or to at least one tower conducting unit 30 via this waveguide coupler 11*b*.

In the examples according to FIG. 1*a* to FIG. 1*e*, the signal generation unit 11, the measurement unit 12 and the control unit 13 are arranged in a common housing of the condition monitoring device 10. However, alternatively, the condition monitoring device 10 may include modular units. For example, the signal generation unit 11, the measurement unit 12 and the control device 13 may be separate modules of the condition monitoring device 10.

In addition, in the examples according to FIG. 1*a* to FIG. 1*e*, the protection unit 23 (e.g., the down conductor 23) is always connected on the left hand side and the tower conducting unit 30 always on the right hand side of the condition monitoring device 10. However a vice versa configuration is of course also possible, i.e. to connect the protection unit 23 (e.g., the down conductor 23) to the left hand side and the tower conducting unit 30 to the right hand side of the condition monitoring device 10.

An embodiment of the waveguide coupler 11*b* and its functional features are described in the following with reference to FIG. 2.

Figure 2:
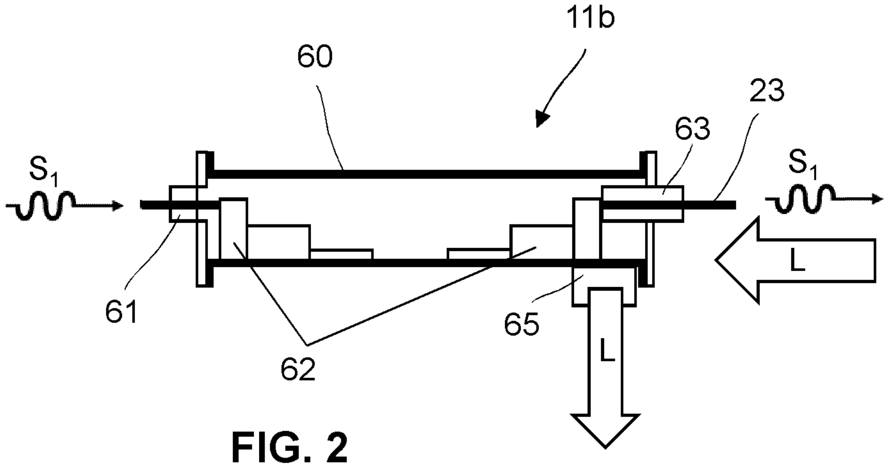
FIG. 2 shows an example of an embodiment of the waveguide coupler of FIG. 1*e;*

FIG. 2 shows a schematic cross section of a waveguide coupler 11*b* (as used in the condition monitoring device 10 of FIG. 1*e*).

The waveguide coupler 11*b* is used to convert probe signals $S_1$ to the protection unit 23 of the lightning protection system LPS and/or to at least one tower conducting unit 30.

For this embodiment the probe signals are assumed to be radio frequency signals.

On the left of FIG. 2 the probe signal $S_1$ is injected into the waveguide coupler 11*b* via a RF connector 61, e.g., via a coaxial cable. The shielding of the coaxial cable may be connected to a chassis 60 of the waveguide coupler 11*b*. The signal core of the coaxial cable may be connected to RF transition elements 62 arranged inside the waveguide coupler 11*b*. From a DC perspective the core and shield are connected together to the chassis 60 and ultimately to the chassis ground 65.

From an RF/Impulse perspective the transition elements 62 "launch" a transverse electromagnetic wave along the waveguide coupler 11*b*.

On the right hand side of the diagram, the transverse electromagnetic wave corresponding to the probe signal $S_1$ hits the second transition elements 62 which convert the probe signal $S_1$ back to an output cable 23,30, which may be the protection unit 23 of the lightning protection system LPS and/or to at least one tower conducting unit 30. Preferably, there is an insulator 63 provided between the waveguide coupler 11*b* and the protection unit 23 of the lightning protection system LPS and/or to at least one tower conducting unit 30.

Specific dimensions and geometry of the waveguide coupler 11*b* and of transitions elements 62 are dependent on the specific frequency of the input signal.

Because the protection unit 23 of the lightning protection system LPS and/or to at least one tower conducting unit 30 cable is directly connected to the second transition 62 on the right of the waveguide coupler 11*b*, an incoming destructive lightning current L is dumped into the waveguide chassis 60 which is in turn directly connected to the system chassis ground 65.

In a possible embodiment, the tower conducting unit 30 is connected downstream the system chassis ground 65.

The waveguide coupler 11*b* ensures that the lighting current path L is controlled and prevents potentially destructive current flow and subsequent voltage transients from adversely affecting the condition monitoring device 10.

In summary, this embodiment of the condition monitoring device 10 including the waveguide coupler 11*b*, provides an injection of the probe signal $S_1$ in the protection unit 23 of the lightning protection system LPS and/or to at least one tower conducting unit 30 whilst providing protection to the injection circuit from the destructive lighting impulse current L.

Figure 3:
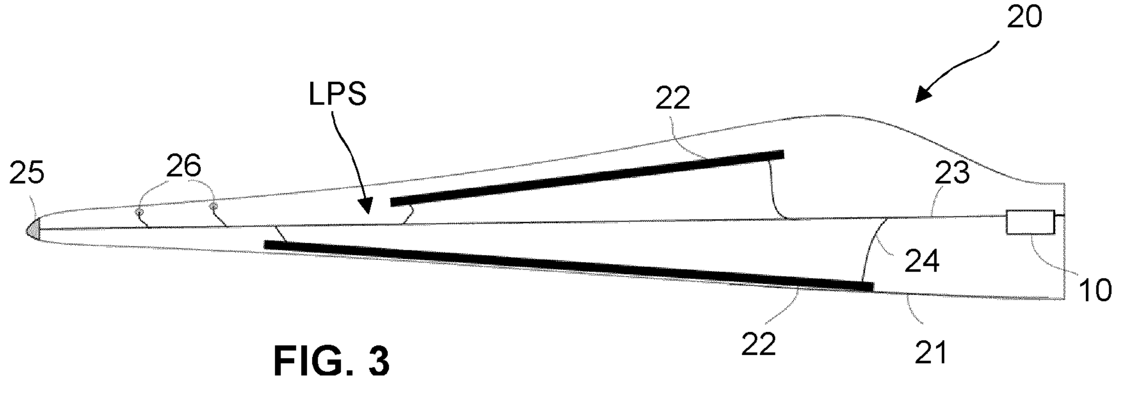
FIG. 3 an example a wind turbine blade comprising an example of a lightning protection system and an embodiment of a condition monitoring device according to the invention.

In FIG. 3 an example of a wind turbine blade 20 including comprising a lightning protection system LPS and a condition monitoring device 10 according to the invention is shown.

The condition monitoring device 10 is located inside the wind turbine blade 20 preferably close to the root-end of the blade and more preferably in proximity to the protection unit 23.

The lightning protection system LPS of the wind turbine blade 20 comprise protection units embedded in the structure of the blade 20. These protection units are routed inside the blade 20 and/or are integrated in the shell 21 of the blade 20. The lightning protection system LPS can be designed with several in parallel routed protection units. Furthermore, in case the blade is constructed with conductive Carbon Fiber Reinforced Polymers (CFRP) 22, these elements are also typically integrated into the LPS.

In the embodiment according to FIG. 3, the protection unit 23 of the lightning protection system LPS is configured as a down conductor 23.

The example of the lightning protection system LPS of the blade 20 as shown in FIG. 3 further includes (but is not limited to) a tip receptor 25, two side receptors 26, two CFRP structural elements 22 and a plurality of respective electrical conductors 24 to the down conductor 23 as respective protection units.

In the shown example, the signal generation unit 11 and the measurement unit 12 of the condition monitoring device 10 are connected to the down conductor 23 of the lightning protection system LPS of the blade. A respective connection of condition monitoring device 10 to the down conductor 23 can relate to one of the embodiments as described with respect to FIGS. 1*a* to 1*e*.

The operation of the condition monitoring device 10 for monitoring a condition of the lightning protection system LPS of blade 20 as shown in FIG. 3 is described below with respect to FIG. 4*a*.

Figure 4A:
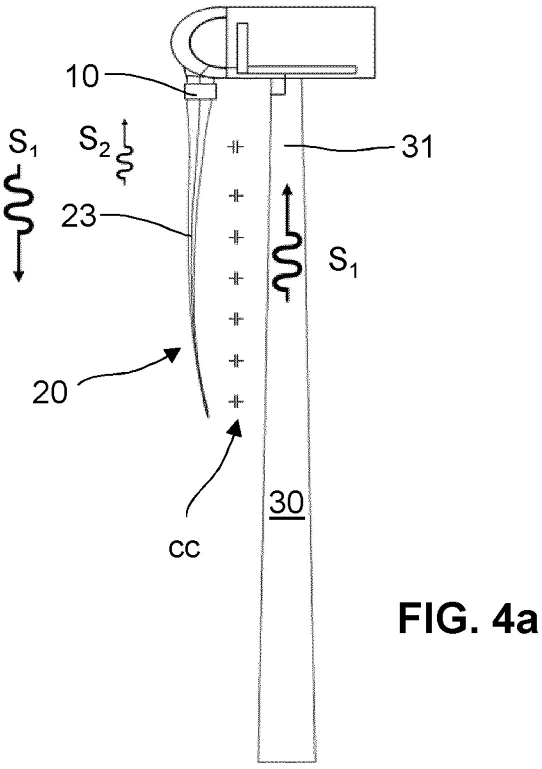
FIG. 4*a* a first example of a method for an operation monitoring of a wind turbine blade with condition monitoring device according to the invention, wherein the probe signal is injected into the lightning protection system of the blade.

In the embodiment as shown in FIG. 4*a*, the condition monitoring device 10 is arranged inside a blade 20 as shown in FIG. 3. The wind turbine including said blade 20 comprises a tower 31.

The probe signal $S_1$ is generated by the signal generation unit 11 and is injected into the down conductor 23 of the lightning protection system LPS of the blade 20.

Preferably high frequency AC pulses and/or repetitive signals with specific rise-times and in specific frequency ranges are injected as probe signals $S_1$ into the down conductor 23 of the blade 20.

When the blade 20 is aligned with the tower 31, a capacitive coupling cc between lightning protection system LPS of the blade 20 and tower conducting unit 30 is a system response of the probe signals $S_1$. Thereby a return-path for response signals $S_2$ inside the blade is enabled, e.g. by resonance or reflectance of the probe signals $S_1$ inside the lightning protection system LPS.

Preferably, the tower conducting unit 30 is formed at least sectionally by the exterior of the tower 31 of the wind turbine. In a possible embodiment, the exterior of the tower 31 includes metal (in particular steel) and/or reinforced concrete, in order to enable a conduction of high frequency signals.

In a possible embodiment, the condition monitoring device 10 is configured to measure the system response every time the respective wind turbine blade 20, comprising the lightning protection system LPS, is aligned with the tower 31, providing a wireless (capacitive) coupling between the LPS (or parts of it) and tower conducting unit 30 and thereby enabling a return-path for the signal.

In an alternative possible embodiment, the probe signals $S_1$ are injected continuously and a respective measurement of the response signal is (only) triggered when the respective blade is aligned with the tower.

The alignment of the tower and the blade may be determined by the response signals itself or by at least one accelerometer.

Depending on the impedance characteristics of the blade 20, the response signal $S_2$ of the probe signal $S_1$ will be recorded by the measurement unit 12.

Subsequently an analysis of the response signal $S_2$ of the blade 20 is performed, and thereby the condition of the lightning protection system LPS of the blade is determined.

Figure 5:
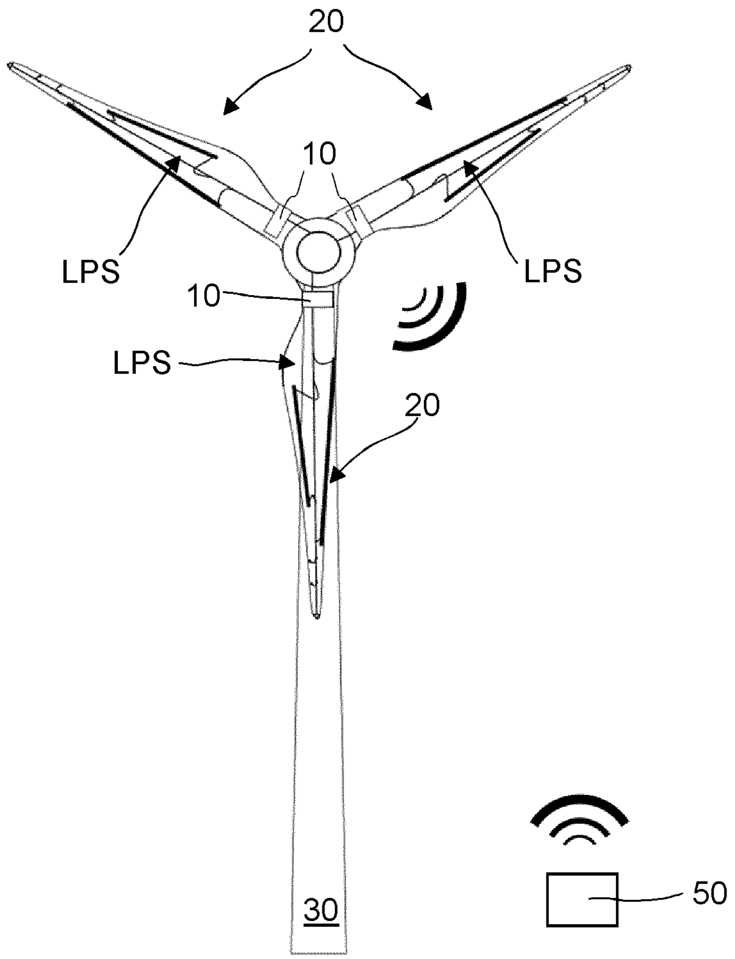
FIG. 5 an example of an embodiment of a condition monitoring system for operation monitoring of a wind turbine according to the invention.

A corresponding signal processing of the response signals $S_2$ (carried out by the control unit 13 and/or a data storage and analyzing device 50—see FIG. 5) can rely on travelling wave and reflection theory, as well as resonance points.

Faults of the lightning protection system LPS to be detected therewith include, but are not limited to, complete disconnected conductors such as a disconnected down conductor 23, disconnection of lightning receptors 5,6 or expanded metal foil, change of impedance inside the blade, such as in specific conductors or equipotential bonding. Algorithms are designed to analyze the response signals $S_2$ which provide the information where and when the fault occurred.

Furthermore, the response signal $S_2$ may identify or predict a potential fault of the lightning protection system LPS of the blade 20 to occur in the future, based on slow changes in the impedance matrix of the lightning protection system LPS of the blade 20, which will cause the measurement responses (system response) to change.

Various algorithms are used to detect faults in the lightning protection system LPS and to locate a potential fault or a slowly degrading connection.

In addition, it is possible to generate a fingerprint signal for a specific blade and apply machine learning & artificial intelligence analysis methods to track significant changes in the response signals $S_2$ and thereby mapping the changes in the conductive system of the blade 20. A fingerprint signal may e.g. refer to an initial signal measured at an initial installation. Significant changes from the original signature of the fingerprint signal (during a short time instance or during a long time change) can indicate different failure modes in the blade.

Figure 4B:
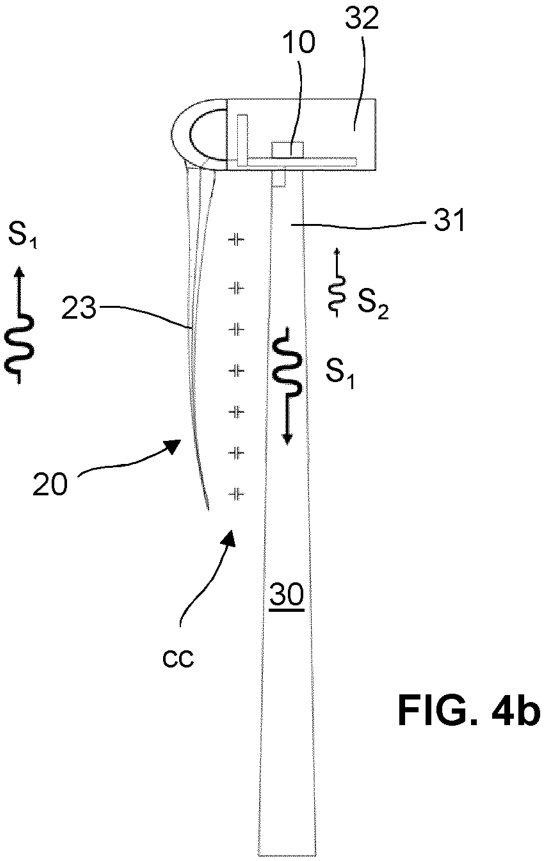
FIG. 4*b* a second example of a method for an operation monitoring of a wind turbine blade with condition monitoring device according to the invention, wherein the probe signal is injected into the tower conducting unit.

In FIG. 4*b* an alternative embodiment for an arrangement of the condition monitoring device 10 is shown.

In the embodiment as shown in FIG. 4*b*, one (single) condition monitoring device 10 is arranged inside the nacelle 32 of the wind turbine.

The probe signal $S_1$ is generated by the signal generation unit 11 and is injected into the tower conducting unit 30.

Preferably, the tower conducting unit 30 is formed at least sectionally by the exterior of the tower 31 of the wind turbine. In a possible embodiment, the exterior of the tower 31 includes metal (in particular steel) and/or reinforced concrete, in order to enable a conduction of high frequency signals.

Alternatively or additionally, the tower conducting unit 30 includes a conductor such as a straight conductive element or a coaxial cable which is arranged at the exterior or inside the tower 31.

This enables to realize essentially the same features and properties regarding a status monitoring of the lightning protection system LPS as described in connection with FIG. 4*a*, except that here the signal path is directed in the opposite direction. Apart from the signal direction and the arrangement of the condition monitoring device 10 in the nacelle 32, the explanations described for FIG. 4*a* also apply to this embodiment according to FIG. 4*b*. The benefit being that we can have only one measurement system looking at three blades in turn.

In FIG. 5, a wind turbine including a condition monitoring system for operation monitoring is shown.

The condition monitoring system comprises in this example three condition monitoring devices 10, where each device 10 is arranged in a respective blade 20 of the wind turbine.

Each blade 20 includes a lightning protection system LPS and the arrangement of the condition monitoring device 10 identical or similar to the one described with respect to FIG. 3.

Further, condition monitoring system comprises a remote data storage and analyzing device 50. The system is configured that the respective control units 13 of the condition monitoring devices 10 may communicate (exchange data) with the remote data storage and analyzing device 50.

Preferably the communication with the remote data storage and analyzing device 50 is a wireless communication.

In a possible embodiment, the data storage and analyzing device 50 is configured as a computer system or as part of a cloud computing system.

The data storage and analyzing device 50 is configured to perform a signal processing of the received response signals $S_2$ as described in connection with respect to FIG. 4*a*.

It is also possible, that the data storage and analyzing device 50 is connected to a plurality of wind turbines (or their respective condition monitoring devices 10). Thus, the quantitative assessment of the condition of wind turbines with respective condition monitoring devices can be compared across a fleet of similar wind turbines, e.g., to provide OEMs a better understanding of the failure mechanisms.

In case of an occurring defect at the lightning protection system LPS of a wind turbine an operator can be informed immediately by the data storage and analyzing device 50, e.g. with the help of a sms, a corresponding app or the like.

In an alternative embodiment of the system described with respect to FIG. 5, the wind turbine comprises a single condition monitoring devices 10 in the nacelle 32 as described with respect to FIG. 4*b*.

REFERENCE SIGNS

10 condition monitoring device
11 signal generation unit
11*a* signal induction device
11*b* waveguide coupler
12 measurement unit
13 control unit
20 blade
21 blade shell
22 CFRP structural elements connected to the protection unit
23 protection unit (down conductor)
24 electrical conductors
25 protection unit (tip receptor)
26 protection unit (side receptor)
30 tower conducting unit
31 tower
32 nacelle
50 (remote) data storage and analyzing device
60 waveguide chassis
61 RF connector
62 transition elements
63 insulator
65 chassis ground
L destructive lighting impulse current
$S_1$ probe signal
$S_2$ response signal
LPS lightning protection system
cc capacitive coupling

The invention claimed is:

1. A condition monitoring device for a lightning protection system (LPS) of a wind turbine blade, wherein the condition monitoring device is mountable to a wind turbine, the condition monitoring device comprising:

a signal generation unit configured to generate and input probe signals into a protection unit of a lightning protection system (LPS) of a wind turbine blade and/or to a tower conducting unit (30);

a measurement unit configured to detect response signals, which are a system response of the probe signals via a wireless capacitive coupling between the lightning protection system (LPS) of the wind turbine blade and the tower conducting unit; and a control unit configured to control the signal unit and the measurement unit and to process the response signals.

2. The condition monitoring device according to claim 1, wherein the protection unit of the lightning protection system (LPS) comprises a down conductor.

3. The condition monitoring device according to claim 1, wherein the tower conducting unit is formed at least sectionally by an exterior of a tower of the wind turbine.

4. The condition monitoring device according to claim 1, wherein the signal generation unit comprises a signal induction device configured to inductively input the probe signals into a system comprising the protection unit and/or into the tower conducting unit.

5. The condition monitoring device according to claim 1, wherein the signal generation unit comprises a waveguide coupler configured to input the probe signals into the protection unit and/or into the tower conducting unit, and wherein the waveguide coupler is configured to limit overvoltage across the condition monitoring device.

6. The condition monitoring device according to claim 1, wherein the signal generation unit is configured to be galvanically connected to the protection unit and/or the tower conducting unit by a hard-wired connection comprising at least one protection device.

7. The condition monitoring device according to claim 1, wherein the measurement unit comprises an inductive measurement device configured to inductively detect the response signals at the protection unit and/or at the at least one tower conducting unit.

8. The condition monitoring device according to claim 1, wherein the measurement unit is configured to be galvanically connected to the protection unit and/or to the tower conducting unit by a hard-wired connection comprising at least one protection device.

9. The condition monitoring device according to claim 1, wherein the probe signals which can be generated by the signal generation unit, are AC signals.

10. The condition monitoring device according to claim 1, wherein the probe signals, which can be generated by the signal generation unit, are high frequency signals.

11. The condition monitoring device according to claim 1, wherein the condition monitoring device is configured to measure a system response every time a respective wind turbine blade, comprising the lightning protection system (LPS), is aligned with a tower.

12. The condition monitoring device according to claim 1, wherein the control unit is configured to communicate with a data storage and analyzing device.

13. A condition monitoring system for operation monitoring of a wind turbine comprising a condition monitoring device, wherein the condition monitoring device comprises:

a signal generation unit configured to generate and input probe signals into a system comprising a protection unit of a lightning protection system (LPS) of a wind turbine blade and/or a tower conducting unit;

a measurement unit configured to detect response signals, which are a system response of the probe signals via a capacitive coupling between the lightning protection system (LPS) of the wind turbine blade and the tower conducting unit;

a control unit configured to control the signal unit and the measurement unit and to process the response signals; and a data storage and analyzing device that is configured to communicate with the control unit of the condition monitoring device in order to receive and store the probe signals and the response signals.

14. A wind turbine comprising:
a wind turbine blade; and
a condition monitoring device comprising:
a signal generation unit configured to generate and input probe signals into a protection unit of a lightning protection system (LPS) of the wind turbine blade and/or to a tower conducting unit;
a measurement unit configured to detect response signals, which are a system response of the probe signals via a wireless capacitive coupling between the lightning protection system (LPS) of the wind turbine blade and the tower conducting unit; and
a control unit configured to control the signal unit and the measurement unit and to process the response signals.

15. The wind turbine according to claim 14, wherein the condition monitoring is arranged in the wind turbine blade of the wind turbine.

16. A method for an operation monitoring of a condition monitoring device comprising:
a signal generation unit configured to generate and input probe signals into a protection unit of a lightning protection system (LPS) of the wind turbine blade and/or to a tower conducting unit;
a measurement unit configured to detect response signals, which are a system response of the probe signals via a wireless capacitive coupling between the lightning protection system (LPS) of the wind turbine blade and the tower conducting unit; and
a control unit configured to control the signal unit and the measurement unit and to process the response signals,
wherein the method comprises:
generating a probe signal;
inputting the probe signal into the protection unit of the lightning protection system (LPS) of the wind turbine blade and/or into the tower conducting unit; and
measuring a response signal which is a signal response of the probe signal via the wireless capacitive coupling between the lightning protection system (LPS) of the wind turbine blade and a tower.

17. The method according to claim 16, wherein the probe signal is an AC signal signals, in particular between 0 A and 5 A and/or 0 V and 50 V, and/or in a frequency range between 100 kHz to 10 GHz, preferably between 500 kHz to 5 GHz.

18. The method according to claim 16, further comprising storing and analyzing the probe signal and the response signal, wherein the analysis is preferably the wind turbine blade and/or the tower conducting unit.

19. The method according to claim 16, wherein the generating, the inputting, and the measuring are performed during operation of the wind turbine and/or wherein the inputting is performed every time the wind turbine blade is aligned with the tower.

* * * * *